United States Patent
Xia et al.

(10) Patent No.: US 10,629,853 B2
(45) Date of Patent: Apr. 21, 2020

(54) EVAPORATION EQUIPMENT

(71) Applicant: WUHAN CHINA STAR OPTOELECTRONICS TECHNOLOGY CO., LTD., Wuhan, Hubei (CN)

(72) Inventors: Cunjun Xia, Hubei (CN); Xin Zou, Wuhan Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 222 days.

(21) Appl. No.: 15/566,712

(22) PCT Filed: Jun. 22, 2017

(86) PCT No.: PCT/CN2017/089609
§ 371 (c)(1),
(2) Date: Oct. 15, 2017

(87) PCT Pub. No.: WO2018/205361
PCT Pub. Date: Nov. 15, 2018

(65) Prior Publication Data
US 2019/0051865 A1    Feb. 14, 2019

(30) Foreign Application Priority Data
May 8, 2017 (CN) .......................... 2017 1 0318766

(51) Int. Cl.
*C23C 14/04* (2006.01)
*H01L 51/56* (2006.01)
(Continued)

(52) U.S. Cl.
CPC .............. *H01L 51/56* (2013.01); *B05C 13/02* (2013.01); *C23C 14/042* (2013.01); *C23C 14/12* (2013.01);
(Continued)

(58) Field of Classification Search
None
See application file for complete search history.

(56) References Cited

U.S. PATENT DOCUMENTS 7,292,427 B1 *   11/2007   Murdoch ............ H01L 21/6838
                                                        361/234
2006/0011136 A1 *   1/2006   Yamazaki ............ C23C 14/042
                                                        118/719
2016/0260902 A1      9/2016   Sonoda et al.

FOREIGN PATENT DOCUMENTS

| CN | 102686764 A | 9/2012 |
| CN | 103168114 A | 6/2013 |
| JP | 2014065959 A * | 4/2014 |

OTHER PUBLICATIONS

English translation for JP2014065959 (Year: 2014).*

* cited by examiner

*Primary Examiner* — Charles Capozzi
(74) *Attorney, Agent, or Firm* — Mark M. Friedman (57) ABSTRACT

An evaporation equipment includes a main chamber and at least one sub-chamber in communication with the main chamber by a valve. The sub-chamber includes a suction plate, a suction tube, and a fixing part. The suction tube passes through the fixing part and the suction plate. When the evaporation equipment evaporates a material on a depositing substrate, the suction tube adsorbs the depositing substrate to the suction plate, the depositing substrate is aligned with a mask plate, and the depositing substrate is fixed to the mask plate by the fixing part.

15 Claims, 7 Drawing Sheets

(51) Int. Cl.
*H01L 27/32* (2006.01)
*C23C 14/56* (2006.01)
*C23C 14/12* (2006.01)
*C23C 14/24* (2006.01)
*C23C 14/50* (2006.01)
*B05C 13/02* (2006.01)

(52) U.S. Cl.
CPC .............. *C23C 14/24* (2013.01); *C23C 14/50* (2013.01); *C23C 14/568* (2013.01); *H01L 27/3244* (2013.01); *H01L 2227/323* (2013.01)

EVAPORATION EQUIPMENT

FIELD OF THE INVENTION

The present disclosure relates to the field of semiconductor processes, and more particularly to an evaporation equipment.

BACKGROUND OF THE INVENTION

Active matrix organic light emitting diodes (AMOLED), with high contrast, wide viewing angles, fast response speed, etc. are attracting increasing amount of attention. A mainstream manufacturing process of a AMOLED full-color display includes using a thermal evaporation method and a fine metal mask (FMM) technology. However, when the evaporation equipment is used to evaporate a tricolor (red, green, and blue) fine metal mask (FMM) technology, color mixing easily occurs, which is a difficult challenge. The color mixing is mainly caused by the process of aligning an evaporation equipment. In the process of aligning the evaporation equipment, only about a 30 mm peripheral portion of a depositing substrate is supported by a fixture. The depositing substrate sags due to gravity. The fine metal mask (FMM) and the depositing substrate contact each other and separate from each other constantly to achieve precise alignment, but defects of the depositing substrate easily occur. The alignment deviation is caused by the deformation of the fine metal mask (FMM) which occurs due to sagging of the depositing substrate, so that color mixing occurs.

A mainstream approach to solving this problem is to use a small substrate to reduce the color mixing. A small substrate with less weight and less sagging can be used to overcome the color mixing, but this is not conducive to a large size substrate and a high generation production line used to reduce the costs and improve the yield.

As a result, it is necessary to provide an evaporation equipment to solve the problems existing in the conventional technologies, as described above.

SUMMARY OF THE INVENTION

An object of the present disclosure is to provide an evaporation equipment which improves the alignment accuracy of a depositing substrate and a mask plate to solve the color mixing caused by the alignment deviation of the depositing substrate and the mask plate in the alignment process.

To achieve the above object, the present disclosure provides an evaporation equipment, including:

a main chamber and at least one sub-chamber in communication with the main chamber by a valve; wherein the sub-chamber includes a suction plate, a suction tube, and a fixing part, and the fixing part is disposed above the suction plate;

wherein the suction tube passes through the fixing part and the suction plate and when the evaporation equipment evaporates a material on a depositing substrate, the suction tube adsorbs the depositing substrate to the suction plate, the depositing substrate is aligned with a mask plate, and the depositing substrate is fixed to the mask plate by the fixing part;

wherein the suction plate has at least one first through hole, the fixing part has at least one second through hole, the at least one first through hole corresponds to the at least one second through hole in a one-by-one manner, so that the suction tube passes through the at least one first through hole and the at least one second through hole to adsorb the depositing substrate;

wherein a surface of the suction plate is flat.

In embodiments of the present disclosure, the first through holes and the second through holes are respectively arranged at equal intervals.

In embodiments of the present disclosure, the sub-chamber further includes a substrate holder for holding the depositing substrate and a mask plate holder for holding the mask plate.

In embodiments of the present disclosure, the substrate holder and the mask plate holder are movable in the sub-chamber.

In embodiments of the present disclosure, the fixing part is a magnet.

In embodiments of the present disclosure, the sub-chamber further includes a pump for emptying the sub-chamber.

In embodiments of the present disclosure, the fixing part is movable above the suction plate.

In embodiments of the present disclosure, the mask plate is a metal mask plate.

An embodiment of the present disclosure further provides another evaporation equipment, including:

a main chamber and at least one sub-chamber in communication with the main chamber by a valve; wherein the sub-chamber includes a suction plate, a suction tube, and a fixing part, and the fixing part is disposed above the suction plate;

Wherein the suction tube passes through the fixing part and the suction plate and when the evaporation equipment evaporates a material on a depositing substrate, the suction tube adsorbs the depositing substrate to the suction plate, the depositing substrate is aligned with a mask plate, and the depositing substrate is fixed to the mask plate by the fixing part.

In embodiments of the present disclosure, the suction plate has at least one first through hole, the fixing part has at least one second through hole, and the at least one first through hole corresponds to the at least one second through hole in a one-by-one manner, so that the suction tube passes through the at least one first through hole and the at least one second through hole to adsorb the depositing substrate.

In embodiments of the present disclosure, the first through holes and the second through holes are respectively arranged at equal intervals.

In embodiments of the present disclosure, a surface of the suction plate is flat.

In embodiments of the present disclosure, the sub-chamber further includes a substrate holder for holding the depositing substrate and a mask plate holder for holding the mask plate.

In embodiments of the present disclosure, the substrate holder and the mask plate holder are movable in the sub-chamber.

In embodiments of the present disclosure, the fixing part is a magnet.

In embodiments of the present disclosure, the sub-chamber further includes a pump for emptying the sub-chamber.

In embodiments of the present disclosure, the fixing part is movable above the suction plate.

In embodiments of the present disclosure, the mask plate is a metal mask plate.

The evaporation equipment in the embodiment of the present disclosure includes a main chamber and at least one sub-chamber in communication with the main chamber. The sub-chamber includes a suction plate, a suction tube, and a fixing part. The suction tube passes through the fixing part and the suction plate and when the evaporation equipment evaporates a material on the depositing substrate, the suction tube adsorbs a depositing substrate to the suction plate. The depositing substrate is aligned with a mask plate and the depositing substrate is fixed to the mask plate by the fixing part. The evaporation equipment of the embodiment improves the alignment accuracy of the depositing substrate and the mask plate to solve the color mixing problem and improve the color.

For more clearly and easily understanding above content of the present disclosure, the following text will take a preferred embodiment of the present disclosure with reference to the accompanying drawings for detailed description as follows.

DESCRIPTION OF THE DRAWINGS

The technical solution, as well as beneficial advantages, of the present disclosure will be apparent from the following detailed description of one or more embodiments of the present disclosure, with reference to the attached drawings. In the drawings.

DETAILED DESCRIPTION OF THE PREFERRED EMBODIMENTS

To further expound the technical solution adopted in the present disclosure and the advantages thereof, a detailed description is given to a preferred embodiment of the present disclosure and the attached drawings. Obviously, the embodiments described herein are only a part of, but not all of, the embodiments of the present disclosure. In view of the embodiments described herein, any other embodiment obtained by a person skilled in the field without offering creative effort is included in a scope claimed by the present disclosure.

Figure 1:
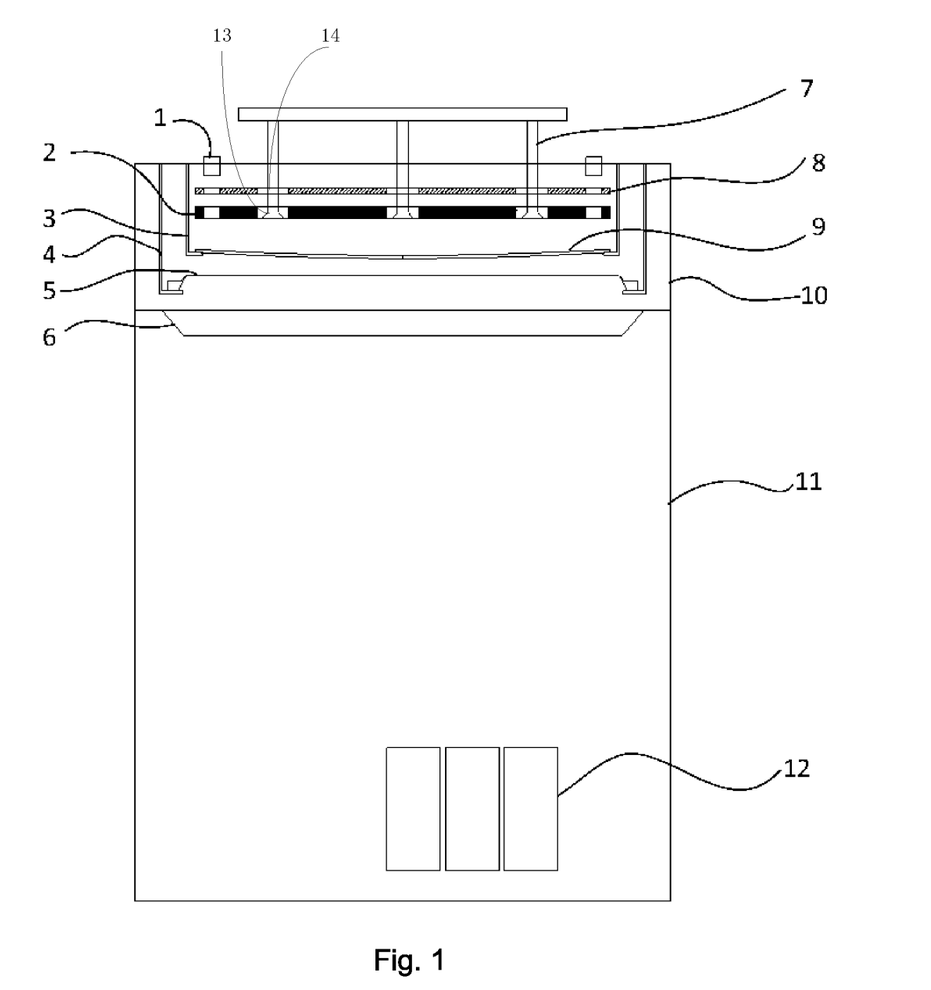
FIG. 1 is a schematic perspective view illustrating an evaporation equipment according to a preferred embodiment of the present disclosure.

Refer now to FIG. 1, which is an evaporation equipment according to a preferred embodiment of the present disclosure. As shown in FIG. 1, the evaporation equipment of the preferred embodiment includes a main chamber 11 and at least one sub-chamber 10 in communication with the main chamber 11 by a valve 6. The sub-chamber 10 includes a pump (not shown) configured to empty the evaporation equipment. Preferably, the pump in the embodiment may be a dry pump, a cold pump, a molecular pump, etc. Further, since the sub-chamber 10 has a high vacuum, the molecular pump and the dry pump can be disposed in the sub-chamber 10 for emptying the evaporation equipment in order to satisfy the high vacuum of the sub-chamber 10. Similarly, in another embodiment, the cold pump and the dry pump are disposed in the sub-chamber 10 and the high vacuum of the sub-chamber 10 can be realized.

When the evaporation equipment operates, the valve 6 is opened first, the valve 6 is closed after the pump empties the evaporation equipment, and alignment of the depositing substrate 9 and the mask plate 5 is completed in the sub-chamber 10.

The evaporation equipment of the preferred embodiment in the present disclosure is different from the prior art in that the evaporation equipment of the present disclosure performs a flattening operation on the depositing substrate 9 in the sub-chamber 10 to prevent the depositing substrate 9 from sagging due to gravity, and alignment deviation of the depositing substrate 9 and the mask plate 5 caused by the sagging depositing substrate 9 can be improved.

Specifically, the sub-chamber 10 includes a substrate holder 3, a mask plate holder 4, a suction plate 2, a suction tube 7, and a fixing part 8. The substrate holder 3 is configured to hold the depositing substrate 9 and the mask plate holder 4 is configured to hold the mask plate 5. The suction plate 2 and the suction tube 7 are configured to flatten the depositing substrate 9. The fixing part 8 is configured to fix the depositing substrate 9 and the mask plate 5 after the alignment is completed.

In the evaporation equipment of the preferred embodiment, the suction tube 7 passes through the fixing part 8 and the suction plate 2 and when the evaporation equipment evaporates a material on the depositing substrate 9, the suction tube 7 adsorbs the depositing substrate 9 to the suction plate 2, the depositing substrate 9 is aligned with the mask plate 5, and the depositing substrate 9 is fixed to the mask plate 5 by the fixing part 8.

In particular, in the preferred embodiment, the fixing part 8 is disposed above the suction plate 2. The substrate holder 3 and the mask plate holder 4 are movably disposed in the sub-chamber 10 so that the suction plate 2, the depositing substrate 9, and the mask plate 5 are spaced apart before the evaporation, so as not to affect the alignment of the depositing substrate 9 and the mask plate 5 due to the fixing part 8.

In addition, the suction plate 2 has at least one first through hole 13, the fixing part 8 has at least one second through hole 14, the at least one first through hole 13 corresponds to the at least one second through hole 14 in a one-by-one manner, so that the suction tube 7 passes through the at least one first through hole 13 and the at least one second through hole 14 to adsorb the depositing substrate 9. The surface of the suction plate 2 is flattened by the suction force of the suction tube 7. In the preferred embodiment, the surface of the suction plate 2 is flat to provide a flat interface for the depositing substrate 9.

In embodiments of the present disclosure, the number of the at least one first through hole 13 and the at least one second through hole 14 are respectively plural, the first through holes 13 and the second through holes 14 are respectively arranged at equal intervals, so that the suction tube 7 can apply a uniform force to the depositing substrate 9 to flatten the depositing substrate 9 after the depositing substrate 9 is adsorbed to the suction plate 2.

Preferably, the fixing part 8 is a magnet, and the mask plate 5 is a metal mask plate. The depositing substrate 9 and the mask plate 5 can be fixed by the magnetic force of the magnet and the metal.

In the evaporation equipment of the preferred embodiment, some components are disposed in the main chamber 11, such as the evaporation source 12, thereby reducing the volume of the sub-chamber 10 and thereby shortening the emptying time of the sub-chamber 10.

Figure 2A:
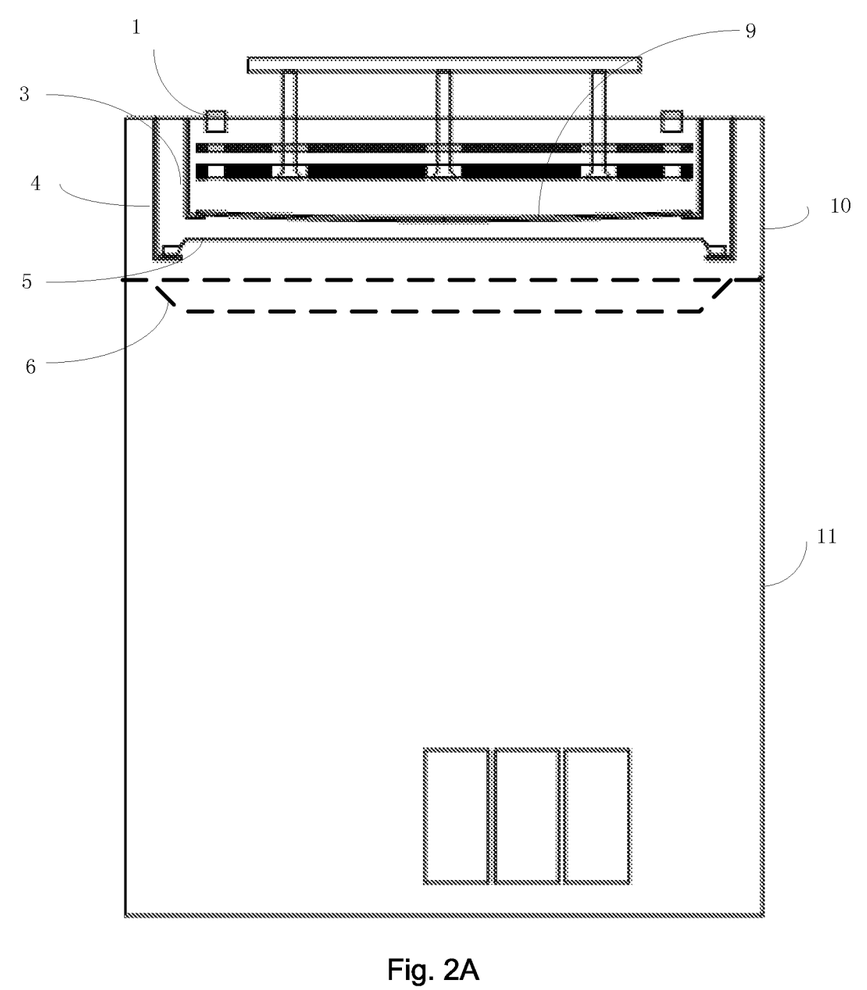
FIGS. 2A-2E are schematic perspective views illustrating operation states of the evaporation equipment according to a preferred embodiment of the present disclosure.

FIGS. 2A-2E are schematic perspective views illustrating operation states of the evaporation equipment according to the preferred embodiment of the present disclosure. Referring now to FIG. 2A, when the evaporation equipment operates, the registration mark 1 makes depositing substrate 9 be disposed on the substrate holder 3, the mask plate 5 is disposed on the mask plate holder 4, the valve 6 is opened, and the sub-chamber 10 and the main chamber 11 are emptied by the pump.

Figure 2B:
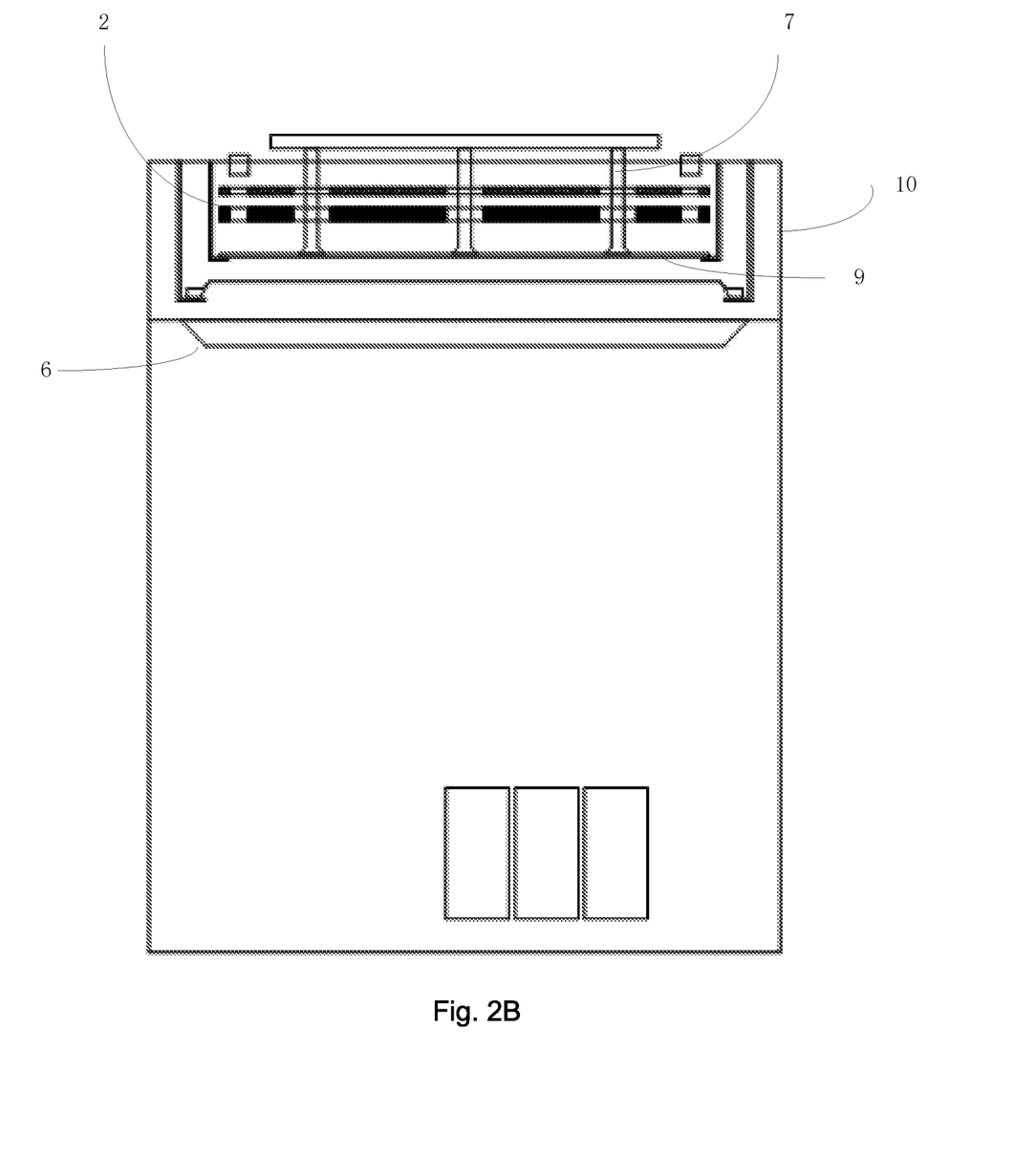
Figure 2C:
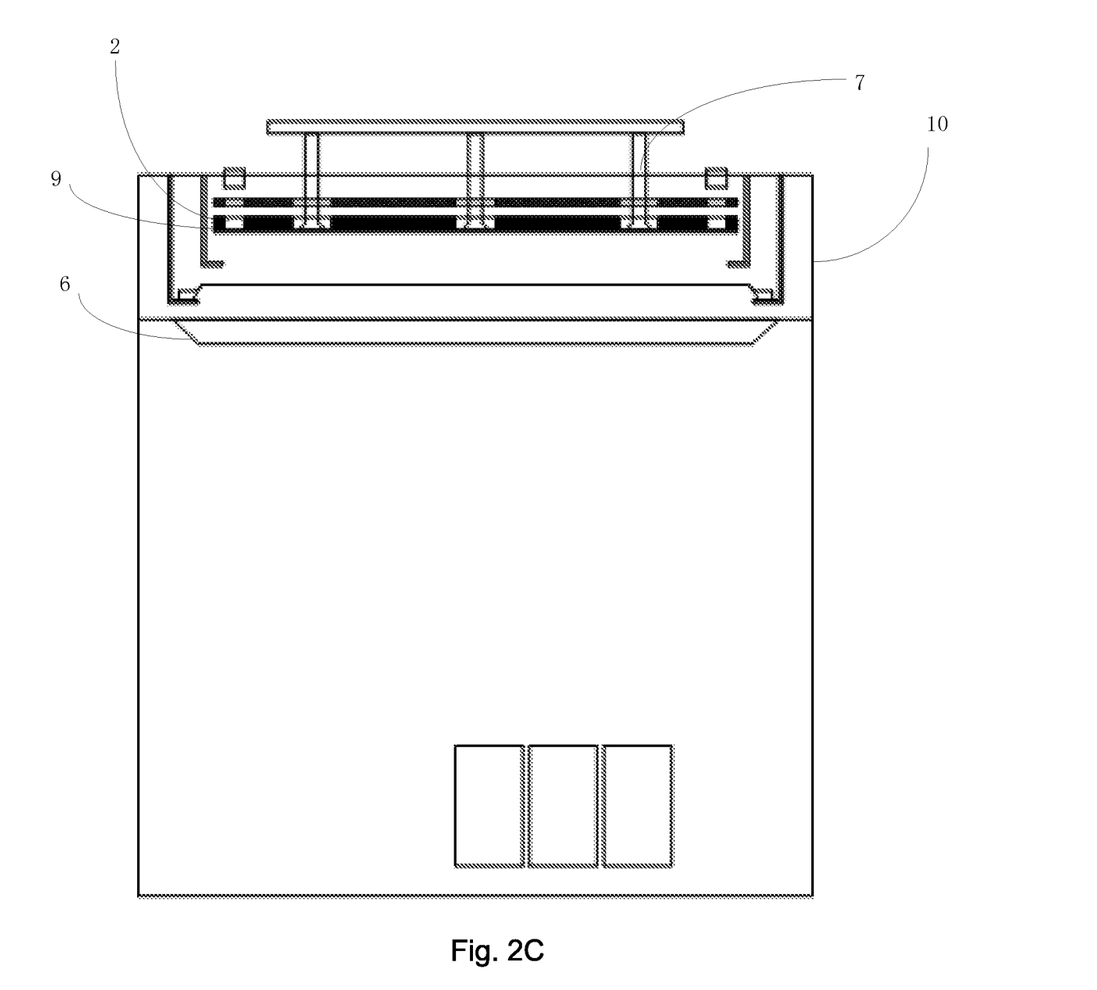

Referring to FIGS. 2B and 2C, the valve 6 is closed, a certain amount of nitrogen is introduced into sub-chamber 10, the depositing substrate 9 is adsorbed onto the suction plate 2 by the suction tube 7, and the flattening operation is performed on the suction plate 2.

Figure 2D:
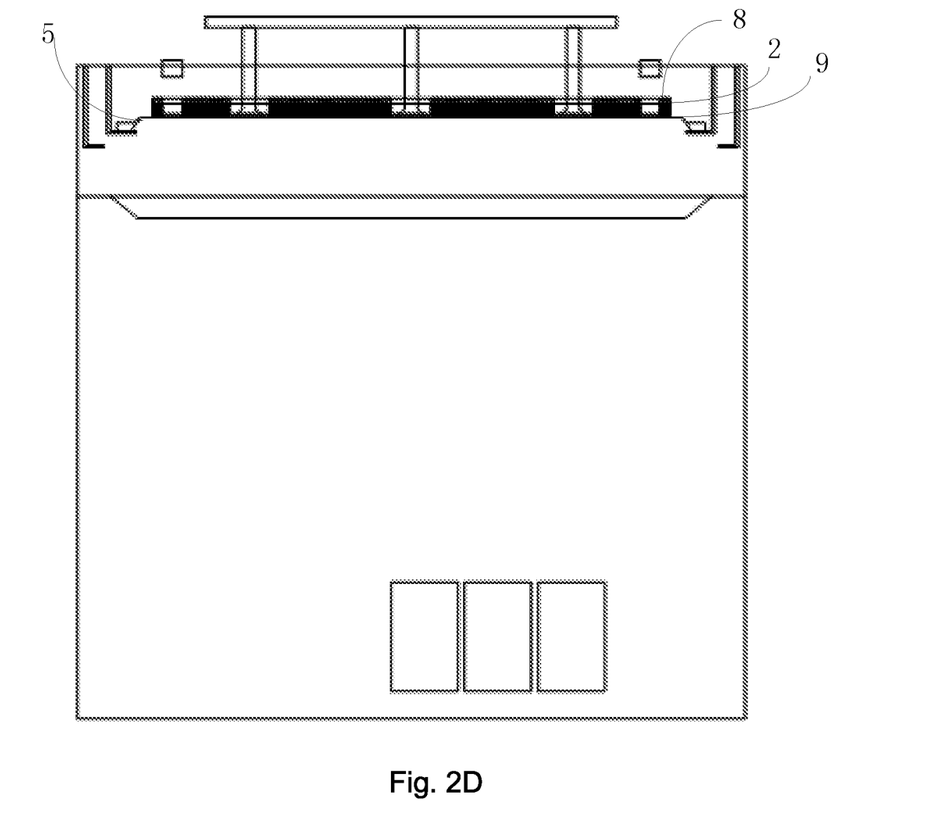

Then, referring to FIG. 2D, the depositing substrate 9 and the mask plate 5 are fixed by the fixing part 8 after the mask plate 5 is aligned with the depositing substrate 9.

Figure 2E:
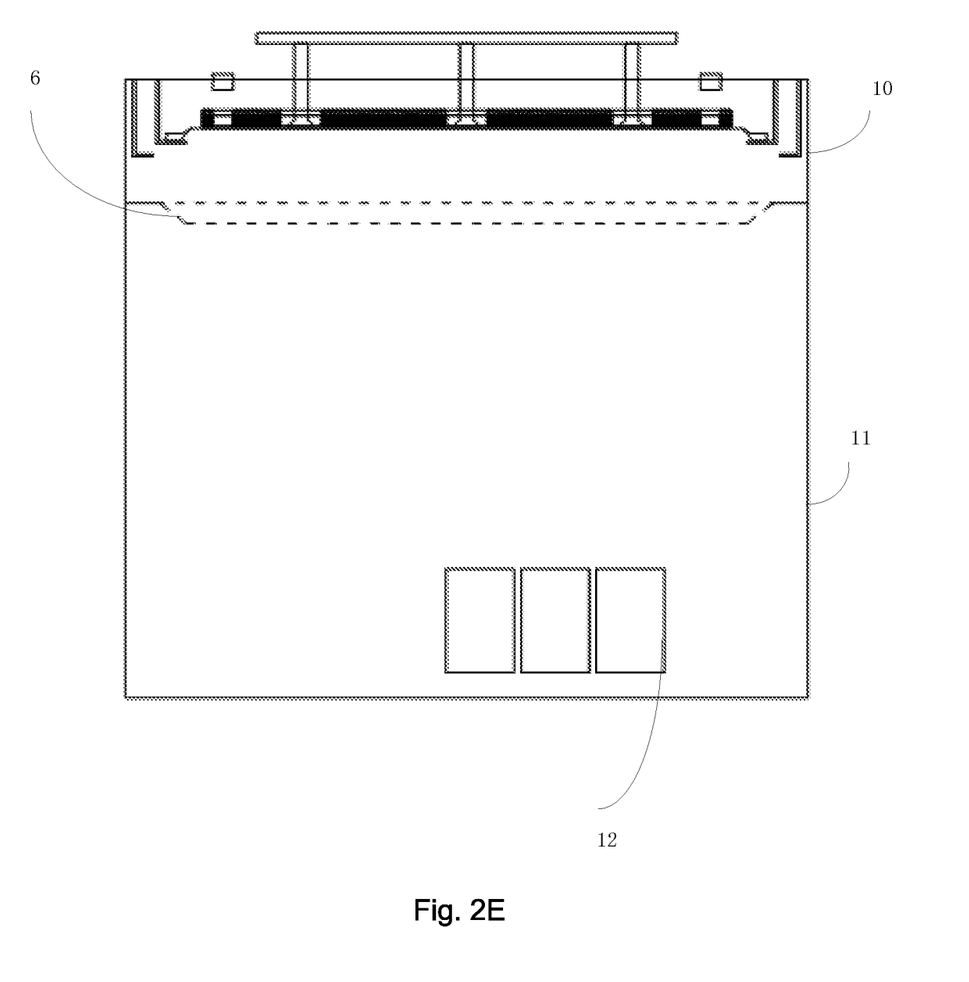

Finally, referring to FIG. 2E, the valve 6 is opened so that the evaporation source 12 received in the main chamber 11 evaporates a material on the depositing substrate 9 after the evacuation to the sub-chamber 10 coincides with the vacuum of the main chamber 11.

Figure 3:
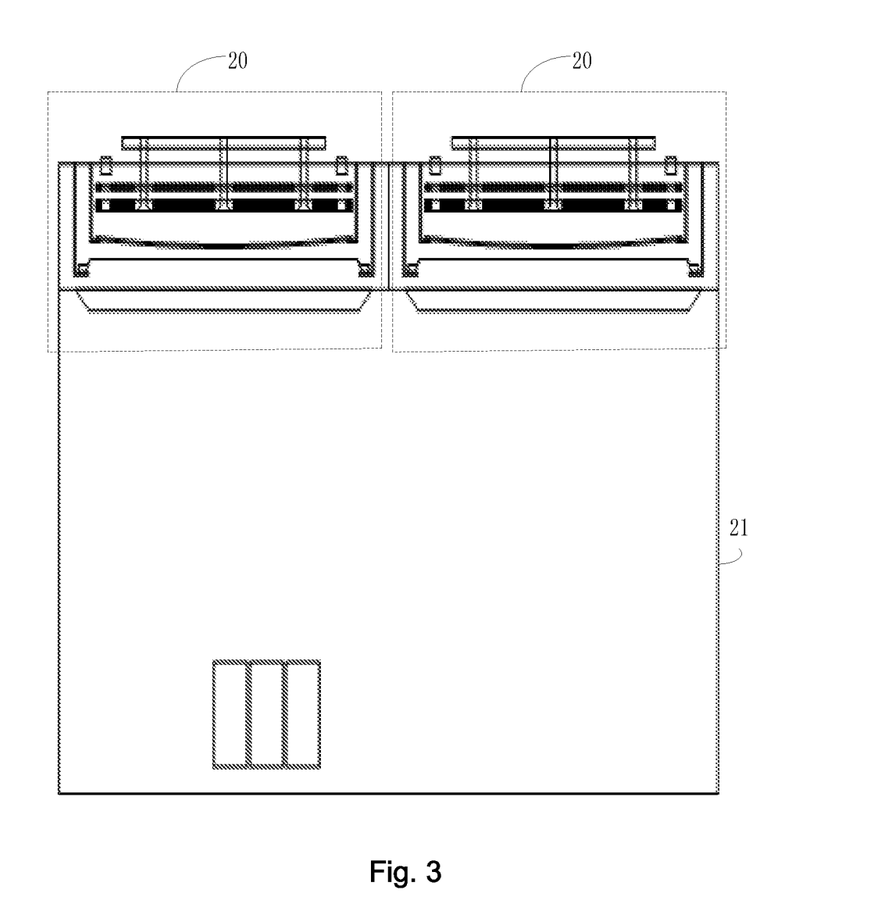
FIG. 3 is a schematic perspective view illustrating another evaporation equipment according to a preferred embodiment of the present disclosure.

FIG. 3 is a schematic perspective view illustrating another evaporation equipment according to a preferred embodiment of the present disclosure. Referring to FIG. 3, the evaporation equipment of the preferred embodiment includes two sub-chambers 20 and a main chamber 20. The two sub-chambers 20 are independently operated, the structure and operation of each sub-chamber 20 are as shown in FIGS. 2A-2E and are not described here, please refer to the description of one sub-chamber structure described above for the details. The evaporation equipment of the embodiment includes two sub-chambers used for the evaporation process. One sub-chamber is used for the alignment process and the other sub-chamber is used for the evaporation process, thereby further improving the efficiency of the evaporation.

The structures of the two sub-chambers 20 are the same as that of the sub-chamber shown in FIG. 1, and the sub-chamber 20 is not described here. Please refer to the description of one sub-chamber structure described above for the details.

The evaporation equipment in the embodiment of the present disclosure includes a main chamber and at least one sub-chamber in communication with the main chamber. The sub-chamber includes a suction plate, a suction tube, and a fixing part. The suction tube passes through the fixing part and the suction plate and when the evaporation equipment evaporates a material on the depositing substrate, the suction tube adsorbs a depositing substrate to the suction plate. The depositing substrate is aligned with a mask plate and the depositing substrate is fixed to the mask plate by the fixing part. The evaporation equipment of the embodiment improves the alignment accuracy of the depositing substrate and the mask plate to solve the color mixing problem and improve the color.

As described above, the evaporation equipment in the embodiment of the present disclosure includes a main chamber and at least one sub-chamber in communication with the main chamber. The sub-chamber includes a suction plate, a suction tube, and a fixing part. The suction tube passes through the fixing part and the suction plate and when the evaporation equipment evaporates a material on the depositing substrate, the suction tube adsorbs a depositing substrate to the suction plate. The depositing substrate is aligned with a mask plate and the depositing substrate is fixed to the mask plate by the fixing part. The evaporation equipment of the embodiment improves the alignment accuracy of the depositing substrate and the mask plate to solve the color mixing problem and improve the color.

The present disclosure has been described with a preferred embodiment thereof. The preferred embodiment is not intended to limit the present disclosure, and it is understood that many changes and modifications to the described embodiment can be carried out without departing from the scope and the spirit of the invention that is intended to be limited only by the appended claims.

What is claimed is:

1. An evaporation equipment, comprising:
   a main chamber and at least one sub-chamber in communication with the main chamber by a valve; wherein the at least one sub-chamber comprises a suction plate, a suction tube, and a fixing part, and the fixing part is disposed above the suction plate;
   wherein the suction tube passes through the fixing part and the suction plate and when the evaporation equipment evaporates a material on a depositing substrate, the suction tube adsorbs the depositing substrate to the suction plate, the depositing substrate is aligned with a mask plate, and the depositing substrate is fixed to the mask plate by the fixing part;
   wherein the suction plate has first through holes, the fixing part has second through holes, the first through holes correspond to the second through holes in a one-by-one manner, so that the suction tube passes through at least one first through hole and at least one second through hole to adsorb the depositing substrate
   wherein a surface of the suction plate is flattened by a suction force of the suction tube, and the surface of the suction plate is flat to provide a flat interface for the depositing substrate;
   wherein the first through holes and the second through holes are respectively arranged at equal intervals, so that the suction tube is configured to apply a uniform force to the depositing substrate to flatten the depositing substrate after the depositing substrate is adsorbed to the suction plate; and wherein the suction plate and the suction tube are both configured to the depositing substrate.

2. The evaporation equipment according to claim 1, wherein the at least one sub-chamber further comprises a substrate holder for holding the depositing substrate and a mask plate holder for holding the mask plate.

3. The evaporation equipment according to claim 2, wherein the substrate holder and the mask plate holder are movable in the at least one sub-chamber.

4. The evaporation equipment according to claim 1, wherein the fixing part is a magnet.

5. The evaporation equipment according to claim 1, wherein the at least one sub-chamber further comprises a pump for vacuuming the at least one sub-chamber.

6. The evaporation equipment according to claim 1, wherein the fixing part is movable above the suction plate.

7. The evaporation equipment according to claim 1, wherein the mask plate is a metal mask plate.

8. An evaporation equipment, comprising:
   a main chamber and at least one sub-chamber in communication with the main chamber by a valve; wherein the at least one sub-chamber comprises a suction plate, a suction tube, and a fixing part, and the fixing part is disposed above the suction plate;
   wherein the suction tube passes through the fixing part and the suction plate and when the evaporation equipment evaporates a material on a depositing substrate, the suction tube adsorbs the depositing substrate to the suction plate, the depositing substrate is aligned with a mask plate, and the depositing substrate is fixed to the mask plate by the fixing part;
   wherein the suction plate has first through holes, the fixing part has second through holes, the suction tube passes through at least one first through hole and at least one second through hole to adsorb the depositing substrate wherein a surface of the suction plate is flattened by a suction force of the suction tube, and the surface of the suction plate is flat to provide a flat interface for the depositing substrate;

wherein the first through holes and the second through holes are respectively arranged at equal intervals, so that the suction tube is configured to apply a uniform force to the depositing substrate to flatten the depositing substrate after the depositing substrate is adsorbed to the suction plate; and wherein the suction plate and the suction tube are both configured to the depositing substrate.

9. The evaporation equipment to claim 8, wherein the first through holes correspond to the second through holes in a one-by-one manner.

10. The evaporation equipment according to claim 8, wherein the at least one sub-chamber further comprises a substrate holder for holding the depositing substrate and a mask plate holder for holding the mask plate.

11. The evaporation equipment according to claim 10, wherein the substrate holder and the mask plate holder are movable in the at least one sub-chamber.

12. The evaporation equipment according to claim 8, wherein the fixing part is a magnet.

13. The evaporation equipment according to claim 8, wherein the
   wherein the at least one sub-chamber further comprises a pump for vacuuming the at least one sub-chamber.

14. The evaporation equipment according to claim 8, wherein the fixing part is movable above the suction plate.

15. The evaporation equipment according to claim 8, wherein the mask plate is a metal mask plate.

* * * * *